(12) United States Patent
Oura et al.

(10) Patent No.: US 12,014,854 B2
(45) Date of Patent: Jun. 18, 2024

(54) MAGNETIC PASTE

(71) Applicant: Ajinomoto Co., Inc., Tokyo (JP)

(72) Inventors: Ichiro Oura, Kawasaki (JP); Tatsuya Homma, Kawasaki (JP); Masanori Yoda, Kawasaki (JP); Takayuki Tanaka, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 569 days.

(21) Appl. No.: 17/224,815

(22) Filed: Apr. 7, 2021

(65) Prior Publication Data

US 2021/0225569 A1 Jul. 22, 2021

Related U.S. Application Data (63) Continuation of application No. PCT/JP2019/039777, filed on Oct. 9, 2019.

(30) Foreign Application Priority Data

Oct. 10, 2018 (JP) ................................. 2018-191824

(51) Int. Cl.
| | | |
|---|---|---|
| H01F 1/37 | (2006.01) | |
| H01F 17/04 | (2006.01) | |
| H01F 41/04 | (2006.01) | |
| H01F 41/14 | (2006.01) | |

(52) U.S. Cl.
CPC ............... *H01F 1/37* (2013.01); *H01F 17/04* (2013.01); *H01F 2017/048* (2013.01); *H01F 41/045* (2013.01); *H01F 41/14* (2013.01)

(58) Field of Classification Search
CPC . H01F 1/37; H01F 17/04; H01F 41/14; H01F 41/045; H01F 2017/048
See application file for complete search history.

(56) References Cited

U.S. PATENT DOCUMENTS

| | | |
|---|---|---|
| 2009/0045905 A1 | 2/2009 | Nakagawa et al. |
| 2010/0277267 A1 | 11/2010 | Bogert et al. |
| 2010/0295643 A1 | 11/2010 | Nakaue et al. |
| 2012/0188046 A1 | 7/2012 | Matsuura et al. |
| 2012/0188049 A1 | 7/2012 | Matsuura et al. |
| 2013/0176098 A1 | 7/2013 | Matsuura et al. |
| 2014/0138570 A1 | 5/2014 | Otsuka et al. |
| 2018/0021853 A1 | 1/2018 | Takadate et al. |

FOREIGN PATENT DOCUMENTS

| | | | |
|---|---|---|---|
| CN | 101808943 A | | 8/2010 |
| CN | 103846427 A | | 6/2014 |
| JP | 4-348007 | | 12/1992 |
| JP | 10-229016 | | 8/1998 |
| JP | 2003297660 A | | 10/2003 |
| JP | 2004-165217 | | 6/2004 |
| JP | 2009-263645 | | 11/2009 |
| JP | 2010-118486 | | 5/2010 |
| JP | 2012-164959 | | 8/2012 |
| JP | 2013-26356 | | 2/2013 |
| JP | 2015-70102 | | 4/2015 |
| JP | 2017-73547 A | | 4/2017 |
| JP | 2018-133358 | | 8/2018 |
| JP | 2018-178254 | * | 11/2018 |
| WO | 2016/185940 A1 | | 11/2016 |

OTHER PUBLICATIONS

Extended European Search Report dated Jul. 15, 2022 in European Patent Application No. 19871218.4, 8 pages.
International Search Report issued in PCT/JP2019/039777 dated Dec. 10, 2019.
Taiwanese Office Action dated Jul. 11, 2023 in Taiwanese Patent Application No. 108136485, 6 pages.
Chinese Office Action mailed on Apr. 12, 2024, in corresponding Chinese Patent Application No. 201980060017.8.

* cited by examiner

*Primary Examiner* — C Melissa Koslow
(74) *Attorney, Agent, or Firm* — Oblon, McClelland, Maier & Neustadt, L.L.P.

(57) ABSTRACT

Magnetic pastes which include a magnetic powder (A) and a binder resin (B), in which, in the particle diameter distribution of the component (A), the 10% particle diameter ($D_{10}$) is 0.2 μm or larger and 2.0 μm or smaller, the 50% particle diameter ($D_{50}$) is 2.0 μm or larger and 4.3 μm or smaller, and the 90% particle diameter ($D_{90}$) is 4.3 μm or larger and 8.5 μm or smaller, suppress the magnetic powder from being unevenly distributed, and are useful for forming inductor elements and circuit boards.

11 Claims, 1 Drawing Sheet

MAGNETIC PASTE

CROSS REFERENCES TO RELATED APPLICATIONS

This application is a continuation of International Patent Application No. PCT/JP2019/039777, filed on Oct. 9, 2019, and claims priority to Japanese Patent Application No. 2018-191824, filed on Oct. 10, 2018, both of which are incorporated herein by reference in their entireties.

BACKGROUND OF THE INVENTION

Field of the Invention

The present invention relates to magnetic pastes, and inductor elements and circuit substrates that are obtained from such a magnetic paste.

Discussion of the Background

Magnetic materials are used for various applications such as motors and inductor elements, and many types of magnetic materials have been proposed to be used for such applications.

For example, Japanese Patent Application Laid-open No. 2015-70102, which is incorporated herein by reference in its entirety, provides a bond magnet including specific magnetic particles and a resin and having excellent heat resistance, and describes that the bond magnet is capable of being suitably used for components such as motors.

For example, Japanese Patent Application Laid-open No. 2012-164959, which is incorporated herein by reference in its entirety, describes that a magnetic paste including specific alloy particles and a binder is applied onto a base film and dried to produce an inductor.

SUMMARY OF THE INVENTION

In recent years, reductions in the size and thickness of a devices such as an inductor element have been in increasing demand, and the formation of a magnetic layer having a finer pattern has been desired. Examples of a method for forming such magnetic layer include a method for forming a magnetic layer from a magnetic paste by using a dispenser.

On the other hand, magnetic powder has a higher specific gravity, and therefore, for example, during storage, with the passage of time, the magnetic powder contained in a magnetic paste sediments and is sometimes unevenly distributed. In general, magnetic powder having a larger particle diameter tends to sediment more easily, and this can cause the uneven distribution of the content of the magnetic powder and the uneven distribution of the particle diameter of the magnetic powder. Furthermore, when a magnetic paste is prepared or before the magnetic paste is used, a degassing operation, such as vacuum degassing or centrifugal degassing, is sometimes performed, and during the degassing operation, magnetic powder contained in the magnetic paste is sometimes unevenly distributed. In particular, centrifugal degassing tends to cause the uneven distribution of the magnetic powder.

When such uneven distribution of the magnetic powder occurs, for example, in a formed magnetic layer, at a magnetic paste portion containing only a smaller amount of the magnetic powder, a desired relative magnetic permeability is not sometimes achieved, or the viscosity and thixotropy decrease, so that it is sometimes difficult to form a magnetic layer. Furthermore, in the case of forming a magnetic layer by using a dispenser, the uneven distribution of the magnetic powder sometimes causes difficulty in discharging the magnetic paste from a dispenser.

Accordingly, it is one object of the present invention to provide novel magnetic pastes in which a magnetic powder is suppressed from being unevenly distributed.

It is another object of the present invention to provide novel an inductor elements and circuit boards that are obtained by using such a magnetic paste These and other objects, which will become apparent during the following detailed description, have been achieved by the inventors' discovery that in a magnetic paste which contains magnetic powder having a predetermined particle diameter distribution, the magnetic powder is suppressed from being unevenly distributed.

Thus, the present invention provides:

(1) A magnetic paste, comprising:
    a magnetic powder (A); and
    a binder resin (B), wherein
    in a particle diameter distribution of the magnetic powder (A), a 10% particle diameter ($D_{10}$) is 0.2 μm or larger and 2.0 μm or smaller, a 50% particle diameter ($D_{50}$) is 2.0 μm or larger and 4.3 μm or smaller, and a 90% particle diameter ($D_{90}$) is 4.3 μm or larger and 8.5 μm or smaller.

(2) The magnetic paste according to (1), wherein the binder resin (B) includes an epoxy resin.

(3) The magnetic paste according to (1) or (2), wherein the magnetic powder (A) is soft magnetic powder.

(4) The magnetic paste according to any one of (1) to (3), wherein the magnetic powder (A) is iron oxide powder.

(5) The magnetic paste according to (4), wherein the iron oxide powder is ferrite containing at least one selected from Ni, Cu, Mn, and Zn.

(6) The magnetic paste according to any one of (1) to (5), wherein the magnetic powder (A) is Fe—Mn-based ferrite.

(7) The magnetic paste according to (6), wherein a content of Mn in the Fe—Mn-based ferrite is 3.0% by mass or higher and 15% by mass or lower.

(8) The magnetic paste according to any one of (1) to (7), wherein a content of the magnetic powder (A) is 60% by mass or higher with respect to 100% by mass of non-volatile components in the magnetic paste.

(9) The magnetic paste according to any one of (1) to (8), wherein $(D_{90}-D_{10})/D_{50}$ is 2.5 or less.

(10) The magnetic paste according to any one of (1) to (9), wherein the magnetic paste is for inductor element formation.

(11) An inductor element, comprising a magnetic layer that is a cured product of the magnetic paste according to any one of (1) to (10).

(12) A circuit substrate, comprising the inductor element according to (11).

According to the present invention, there can be provided a magnetic paste in which magnetic powder is suppressed from being unevenly distributed, and an inductor element and a circuit board that are obtained by using the magnetic paste.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
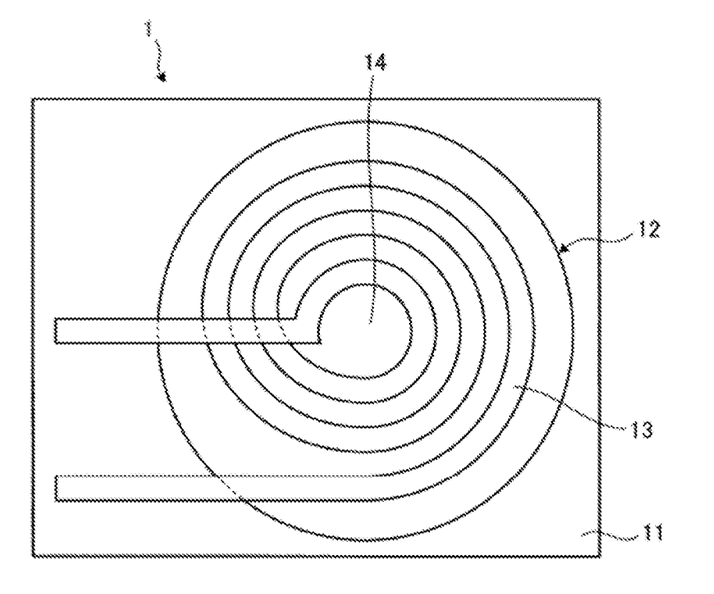
The FIGURE is a schematic plan view of an inductor element according to an embodiment of the present invention.

Hereinafter, embodiments of the present invention will be described with reference to the drawings. Note that the drawings just schematically illustrate the shape, size, and arrangement of constituents to the extent of aiding the understanding of the invention. The present invention is not limited by the following embodiments, and constituents may be suitably changed. Configurations according to the embodiments of the present invention are not necessarily produced or used in accordance with the illustrated arrangement examples.

Magnetic Paste

A magnetic paste of the present invention contains a magnetic powder (A) and a binder resin (B), in which, in the particle diameter distribution of the component (A), the 10% particle diameter ($D_{10}$) is 0.2 μm or larger and 2.0 μm or smaller, the 50% particle diameter ($D_{50}$) is 2.0 μm or larger and 4.3 μm or smaller, and the 90% particle diameter ($D_{90}$) is 4.3 μm or larger and 8.5 μm or smaller.

In the present invention, since the magnetic paste contains the magnetic powder having a predetermined particle diameter distribution, the magnetic powder is suppressed from being unevenly distributed in the magnetic paste, and as a result, the magnetic paste capable of being more easily discharged from a dispenser or the like can be achieved. Furthermore, a cured product of this magnetic paste can have an enhanced relative magnetic permeability at a frequency of 10 to 200 MHz.

The magnetic paste may further contain a curing accelerator (C), a dispersant (D), and other additives (E), if needed. Hereinafter, the components contained in the magnetic paste of the present invention will be described in detail.

Magnetic Powder (A)

The magnetic paste contains the magnetic powder (A). The magnetic powder (A) has a particle diameter distribution in which the 10% particle diameter ($D_{10}$) is 0.2 μm or larger and 2.0 μm or smaller, the 50% particle diameter ($D_{50}$) is 2.0 μm or larger and 4.3 μm or smaller, and the 90% particle diameter ($D_{90}$) is 4.3 μm or larger and 8.5 μm or smaller. The magnetic paste containing the magnetic powder (A) having the above-described particle diameter distribution can suppress the uneven distribution of the magnetic powder in the magnetic paste. Furthermore, the magnetic paste containing the magnetic powder (A) having the above-described particle diameter distribution allows a cured product of the magnetic paste to have an enhanced relative magnetic permeability. Note that the above-described particle diameter distribution indicates the particle diameter distribution of the entirety of the magnetic powder (A) contained in the magnetic paste.

The particle diameter distribution of the magnetic powder (A) can be measured by laser diffraction scattering based on the Mie scattering theory. Specifically, the particle diameter distribution of the magnetic powder (A) is created on the basis of volume by using a laser diffraction scattering type particle diameter distribution measurement device, whereby the 10% particle diameter ($D_{10}$), the 50% particle diameter ($D_{50}$), and the 90% particle diameter ($D_{90}$) can be measured.

As a measurement sample, what is obtained by dispersing the magnetic powder (A) in pure water by supersonic waves can be preferably used. As the laser diffraction scattering type particle diameter distribution measurement device, for example, LA-960, manufactured by HORIBA, Ltd. or SALD-2200, manufactured by SHIMADZU CORPORATION can be used.

The 10% particle diameter ($D_{10}$) in the particle diameter distribution means a particle diameter at the time when, in a particle diameter distribution curve resulting from the measurement of the particle diameter distribution by the above-described method, an integrated volume obtained by adding up volumes in increasing order of particle diameter reaches 10%. The 50% particle diameter ($D_{50}$) means a particle diameter at the time when, in the particle diameter distribution curve resulting from the measurement of the particle diameter distribution by the above-described method, an integrated volume obtained by adding up volumes in increasing order of particle diameter reaches 50%. The 90% particle diameter ($D_{90}$) means a particle diameter at the time when, in the particle diameter distribution curve resulting from the measurement of the particle diameter distribution by the above-described method, an integrated volume obtained by adding up volumes in increasing order of particle diameter reaches 90%. Here, the average particle diameter of the magnetic powder (A) means the 50% particle diameter ($D_{50}$). Hereinafter, the 10% particle diameter ($D_{10}$) is sometimes referred to as $D_{10}$, the 50% particle diameter ($D_{50}$) is sometimes referred to as $D_{50}$, and the 90% particle diameter ($D_{90}$) is sometimes referred to as $D_{90}$.

From the viewpoint of suppressing the uneven distribution of the magnetic powder in the magnetic paste, $D_{10}$ in the particle diameter distribution is 0.2 μm or larger, preferably 0.25 μm or larger, and more preferably 0.3 μm or larger. The upper limit of $D_{10}$ is 2.0 μm or smaller, preferably smaller than 2.0 μm, more preferably 1.95 μm or smaller, and still more preferably 1.9 μm or smaller.

From the viewpoint of suppressing the uneven distribution of the magnetic powder in the magnetic paste, $D_{50}$ in the particle diameter distribution is 2.0 μm or larger, preferably 2.05 μm or larger, and more preferably 2.1 μm or larger. The upper limit of $D_{50}$ is 4.3 μm or smaller, preferably smaller than 4.3 μm, more preferably 4.25 μm or smaller, and still more preferably 4.2 μm or smaller.

From the viewpoint of suppressing the uneven distribution of the magnetic powder in the magnetic paste, $D_{90}$ in the particle diameter distribution is 4.3 μm or larger, preferably 4.35 μm or larger, and more preferably 4.4 μm or larger. The upper limit of $D_{90}$ is 8.5 μm or smaller, preferably 8.45 μm or smaller, and more preferably 8.4 μm or smaller.

From the viewpoint of suppressing the uneven distribution of the magnetic powder in the magnetic paste, $D_{50}-D_{10}$ is preferably 1.5 μm or larger, more preferably 1.6 μm or larger, still more preferably 1.7 μm or larger, still more preferably 1.8 μm or larger, and still more preferably 1.9 μm or larger. The upper limit of $D_{50}-D_{10}$ is preferably 4.1 μm or smaller, more preferably 3 μm or smaller, and still more preferably 2.5 μm or smaller.

From the viewpoint of suppressing the uneven distribution of the magnetic powder in the magnetic paste, $D_{90}-D_{10}$ is preferably 4.3 μm or larger, more preferably 4.4 μm or larger, still more preferably 4.5 μm or larger, and still more preferably 4.6 μm or larger. The upper limit of $D_{90}-D_{10}$ is preferably 8.3 μm or smaller, more preferably 7 μm or smaller, and still more preferably 6.5 μm or smaller.

From the viewpoint of suppressing the uneven distribution of the magnetic powder in the magnetic paste, $D_{90}/D_{50}$ is preferably 2.7 or less, more preferably 2.6 or less, and still more preferably 2.5 or less. The lower limit of $D_{90}/D_{50}$ is preferably 1 or more, more preferably 1.3 or more, and still more preferably 1.5 or more.

From the viewpoint of suppressing the uneven distribution of the magnetic powder in the magnetic paste, $D_{90}/D_{10}$ is preferably 14 or less, more preferably 13.5 or less, and still more preferably 13 or less. The lower limit of $D_{90}/D_{10}$ is preferably 1 or more, more preferably 2 or more, still more preferably 3 or more, still more preferably 4 or more, and still more preferably 4.5 or more.

From the viewpoint of suppressing the uneven distribution of the magnetic powder in the magnetic paste, $(D_{90}-D_{10})/(2 \times D_{50}-D_{10})$ is preferably 2 or less, more preferably 1.8 or less, and still more preferably 1.5 or less. The lower limit of $(D_{90}-D_{10})/(2 \times D_{50}-D_{10})$ is preferably 0.1 or more, more preferably 0.3 or more, and still more preferably 0.5 or more.

From the viewpoint of suppressing the uneven distribution of the magnetic powder in the magnetic paste, $(D_{90}-D_{10})/D_{50}$ is preferably 2.5 or less, more preferably 2.4 or less, and still more preferably 2.3 or less. The lower limit of $(D_{90}-D_{10})/D_{50}$ is preferably 1 or more, more preferably 1.3 or more, still more preferably 1.5 or more, and particularly preferably 1.7 or more.

Although the magnetic powder (A) may be either soft magnetic powder or hard magnetic powder, the magnetic powder (A) is preferably soft magnetic powder from the viewpoint of suppressing the uneven distribution of the magnetic powder.

Examples of the magnetic powder (A) include iron oxide powder, such as Fe—Mn based ferrite, Mg—Zn based ferrite, Mn—Zn based ferrite, Mn—Mg based ferrite, Cu—Zn based ferrite, Mg—Mn—Sr based ferrite, Ni—Zn based ferrite, Ba—Zn based ferrite, Ba—Mg based ferrite, Ba—Ni based ferrite, Ba—Co based ferrite, Ba—Ni—Co based ferrite, Y based ferrite, ferric oxide powder, and triiron tetraoxide; pure iron powder; iron alloy-based metal powder, such as Fe—Si based alloy powder, Fe—Si—Al based alloy powder, Fe—Cr based alloy powder, Fe—Cr—S based alloy powder, Fe—Ni—Cr based alloy powder, Fe—Cr—Al based alloy powder, Fe—Ni based alloy powder, Fe—Ni—Mo based alloy powder, Fe—Ni—Mo—Cu based alloy powder, Fe—Co based alloy powder, and Fe—Ni—Co based alloy powder; and amorphous alloys, such as a Co group amorphous alloy.

In particular, the magnetic powder (A) is preferably iron oxide powder from the viewpoint of suppressing the uneven distribution of the magnetic powder in the magnetic paste. The iron oxide powder is preferably ferrite containing at least one selected from Ni, Cu, Mn, and Zn, and is more preferably Fe—Mn based ferrite. As for the Fe—Mn based ferrite, the content of Mn in the Fe—Mn based ferrite is preferably 0.5% by mass or higher, more preferably 3.0% by mass or higher, and still more preferably 5.0% by mass or higher, and preferably 25% by mass or lower, more preferably 20% by mass or lower, and still more preferably 15% by mass or lower, with respect to 100% by mass of the Fe—Mn based ferrite.

Commercially available magnetic powder may be used as the magnetic powder (A), and two or more kinds of the magnetic powder may be used in combination. Specific examples of the commercially available magnetic powder to be used include M-series, such as M05S, manufactured by Powdertech Co., Ltd.; PST-S, manufactured by Sanyo Special Steel Co., Ltd; AW2-08, AW2-08PF20F, AW2-08PF10F, AW2-08PF3F, Fe-3.5Si-4.5CrPF20F, Fe-50NiPF20F, and Fe-80Ni-4MoPF20F, manufactured by EPSON ATMIX Corporation; LD-M, LD-MH, KNI-106, KNI-106GSM, KNI-106GS, KNI-109, KNI-109GSM, and KNI-109GS, manufactured by JFE Chemical Corporation; KNS-415, BSF-547, BSF-029, BSN-125, BSN-125, BSN-714, BSN-828, S-1281, S-1641, S-1651, S-1470, S-1511, and S-2430, manufactured by TODA KOGYO CORP.; JR09P2, manufactured by Japan Metals & Chemicals Co., Ltd; NanoTek, manufactured by CIK NanoTek Corporation; JEMK-S and JEMK-H, manufactured by KINSEI MATEC CO., LTD; and Yttrium iron oxide, manufactured by ALDRICH.

The magnetic powder (A) preferably has a spherical shape. A value (an aspect ratio) obtained by dividing the length of the major axis of the magnetic powder by the length of the minor axis of the magnetic powder is preferably 2 or less, more preferably 1.5 or less, and still more preferably 1.2 or less, and is preferably more than 1, and more preferably 1.05 or more. Generally, when the magnetic powder has not a spherical shape but a flat shape, the relative magnetic permeability can be more easily enhanced. However, in the present invention, the magnetic powder having a spherical shape is preferably used from the viewpoints of reducing magnetic loss and achieving a magnetic paste having a preferable viscosity.

From the viewpoint of enhancing relative magnetic permeability, the specific surface area of the magnetic powder (A) is preferably 0.05 m$^2$/g or larger, more preferably 0.1 m$^2$/g or larger, and still more preferably 0.3 m$^2$/g or larger. In addition, the specific surface area of the magnetic powder (A) is preferably 15 m$^2$/g or smaller, more preferably 12 m$^2$/g or smaller, and still more preferably 10 m$^2$/g or smaller. The specific surface area of the magnetic powder (A) can be measured by the BET method.

From the viewpoint of enhancing the relative magnetic permeability, the true specific gravity of the magnetic powder (A) is preferably 3.5 g/cm$^3$ or more, more preferably 4.0 g/cm$^3$ or more, and still more preferably 4.5 g/cm$^3$ or more, and is preferably 6.5 g/cm$^3$ or less, more preferably 6.0 g/cm$^3$ or less, and still more preferably 5.5 g/cm$^3$ or less. The true specific gravity can be measured by a pycnometer method.

From the viewpoints of enhancing relative magnetic permeability and magnetic loss, the content (% by volume) of the magnetic powder (A) is preferably 10% by volume or higher, more preferably 20% by volume or higher, and still more preferably 30% by volume or higher, with respect to 100% by volume of non-volatile components in the magnetic paste. In addition, the content of the magnetic powder (A) is preferably 85% by volume or lower, more preferably 80% by volume or lower, and still more preferably 75% by volume or lower.

From the viewpoints of enhancing relative magnetic permeability and reducing magnetic loss, the content (% by mass) of the magnetic powder (A) is preferably 50% by mass or higher, more preferably 55% by mass or higher, and still more preferably 60% by mass or higher, with respect to 100% by mass of non-volatile components in the magnetic paste. In addition, the content of the magnetic powder (A) is preferably 95% by mass or lower, more preferably 90% by mass or lower, and still more preferably 85% by mass or lower.

Note that, in the present invention, the content of each of the components in the magnetic paste represents the amount of the component when the amount of non-volatile components in the magnetic paste is taken as 100% by mass, unless otherwise specified.

The magnetic powder (A) may be used alone or two or more kinds thereof may be used in combination. For example, by making the classification of the magnetic powder (A), the magnetic powder (A) can be adjusted to have a predetermined particle diameter distribution. The above-mentioned particle diameter distribution indicates the particle diameter distribution of the entirety of the component (A) contained in the magnetic paste. Therefore, it is beneficial that the component (A) including a mixture of two or more kinds of magnetic powders is adjusted so as to have a predetermined particle diameter distribution. For example, it is beneficial that a plurality of kinds of magnetic powders each not having the predetermined particle diameter distribution are mixed, so that the entirety of the component (A) has the predetermined particle diameter distribution.

Binder Resin (B)

The magnetic paste contains the binder resin (B). Examples of the binder resin (B) include thermosetting resins, such as epoxy resin, phenol based resin, naphthol based resin, benzoxazine based resin, active ester based resin, cyanate ester based resin, carbodiimide based resin, amine based resin, and acid anhydride based resin; and thermoplastic resins, such as phenoxy resin, acrylic resin, polyvinyl acetal resin, butyral resin, polyimide resin, polyamideimide resin, polyether sulfone resin, and polysulfone resin. As the binder resin (B), thermosetting resins to be used for forming an insulating layer of a wiring board are preferably used, and among them, epoxy resin is more preferably used. The binder resin (B) may be used alone or two or more kinds thereof may be used in combination. Hereinafter, the resins will be described.

Here, components capable of reacting with epoxy resin to cure the magnetic paste, such as phenol based resin, naphthol based resin, benzoxazine based resin, active ester based resin, cyanate ester based resin, carbodiimide based resin, amine based resin, and acid anhydride based resin, are sometimes collectively referred to as a "curing agent".

Thermosetting Resin

Examples of the epoxy resin serving as a thermosetting resin include a glycyrol epoxy resin; a bisphenol A epoxy resin; a bisphenol F epoxy resin; a bisphenol S epoxy resin; a bisphenol AF epoxy resin; a dicyclopentadiene epoxy resin; a trisphenol epoxy resin; a phenol novolac epoxy resin; a tert-butyl-catechol epoxy resin; epoxy resins having a condensed ring structure, such as a naphthol novolac epoxy resin, a naphthalene epoxy resin, a naphthol epoxy resin, and an anthracene epoxy resin; a glycidyl amine epoxy resin; a glycidyl ester epoxy resin; a cresol novolac epoxy resin; a biphenyl epoxy resin; a linear aliphatic epoxy resin; an epoxy resin having a butadiene structure; a cycloaliphatic epoxy resin; a heterocyclic epoxy resin; a spiro ring-containing epoxy resin; a cyclohexane dimethanol epoxy resin; a trimethylol epoxy resin; and a tetraphenyl ethane epoxy resin. The epoxy resin may be used alone or two or more kinds thereof may be used in combination. The epoxy resin is preferably at least one selected from a bisphenol A epoxy resin, and a bisphenol F epoxy resin.

The epoxy resin preferably includes an epoxy resin having two or more epoxy groups in one molecule. The epoxy resin preferably has an aromatic structure, and, in the case where the epoxy resin includes two or more kinds of epoxy resins, at least one of the epoxy resins more preferably has an aromatic structure. The aromatic structure is a chemical structure generally defined as aromatic series, and includes polycyclic aromatic series and heteroaromatic rings. The ratio of an epoxy resin having two or more epoxy groups in one molecule is preferably 50% by mass or higher, more preferably 60% by mass or higher, and still more preferably 70% by mass or higher with respect to 100% by mass of non-volatile components of epoxy resins.

Epoxy resin includes an epoxy resin that remains liquid at a temperature of 25° C. (hereinafter, sometimes referred to as "liquid epoxy resin") and an epoxy resin that remains solid at a temperature of 25° C. (hereinafter, sometimes referred to as "solid epoxy resin"). In the case where the magnetic paste contains an epoxy resin as the component (B), the epoxy resin may be only a liquid epoxy resin, or may be only a solid epoxy resin, or may be a combination of a liquid epoxy resin and a solid epoxy resin. For example, when the magnetic paste contains a large amount of magnetic powder in order to enhance the relative magnetic permeability, the magnetic paste preferably contains only a liquid epoxy resin from the viewpoint of preventing the viscosity of the magnetic paste from becoming excessively high and the viewpoint of more easily creating a paste form.

The liquid epoxy resin is preferably a glycyrol epoxy resin, a bisphenol A epoxy resin, a bisphenol F epoxy resin, a bisphenol AF epoxy resin, a naphthalene epoxy resin, a glycidyl ester epoxy resin, a glycidyl amine epoxy resin, a phenol novolac epoxy resin, a cycloaliphatic epoxy resin having an ester skeleton, a cyclohexane dimethanol epoxy resin, or an epoxy resin having a butadiene structure, and is more preferably a glycyrol epoxy resin, a bisphenol A epoxy resin, or a bisphenol F epoxy resin. Specific examples of the liquid epoxy resin include HP4032, HP4032D, and HP4032SS (naphthalene epoxy resins), manufactured by DIC Corporation; 828US and jER828EL (bisphenol A epoxy resins), jER807 (a bisphenol F epoxy resin), and jER152 (a phenol novolac epoxy resin), manufactured by Mitsubishi Chemical Corporation; 630 and 630LSD, manufactured by Mitsubishi Chemical Corporation, and ED-523T (a glycyrol epoxy resin (ADEKA GLYCIROL)), EP-3980S (a glycidyl amine epoxy resin), and EP-4088S (dicyclopentadiene epoxy resin), manufactured by ADEKA Corporation; ZX1059 (a mixed product of a bisphenol A epoxy resin and a bisphenol F epoxy resin), manufactured by Nippon Steel & Sumikin Chemical Co., Ltd.; EX-721 (a glycidyl ester epoxy resin), manufactured by Nagase ChemteX Corporation; Celloxide 2021P (a cycloaliphatic epoxy resin having an ester skeleton) and PB-3600 (an epoxy resin having a butadiene structure), manufactured by Daicel Corporation; and ZX1658 and ZX1658GS (liquid 1,4-glycidyl cyclohexane), manufactured by NIPPON STEEL Chemical & Material Co., Ltd. These liquid epoxy resins may be used alone or two or more kinds thereof may be used in combination.

The solid epoxy resin is preferably a naphthalene tetrafunctional epoxy resin, a cresol novolac epoxy resin, a dicyclopentadiene epoxy resin, a trisphenol epoxy resin, a naphthol epoxy resin, a biphenyl epoxy resin, a naphthylene ether epoxy resin, an anthracene epoxy resin, a bisphenol A epoxy resin, or a tetraphenylethane epoxy resin, and more preferably a naphthalene tetrafunctional epoxy resin, a naphthol epoxy resin, or a biphenyl epoxy resin. Specific examples of the solid epoxy resin include HP4032H (a naphthalene epoxy resin), HP-4700 and HP-4710 (naphthalene tetrafunctional epoxy resins), N-690 (a cresol novolac epoxy resin), N-695 (a cresol novolac epoxy resin), HP-7200, HP-7200HH, and HP-7200H (dicyclopentadiene epoxy resins), EXA-7311, EXA-7311-G3, EXA-7311-G4, EXA-7311-G4S, and HP6000 (naphtylene ether epoxy resins), manufactured by DIC Corporation; EPPN-502H (a trisphenol epoxy resin), NC7000L (a naphthol novolac epoxy resin), NC3000H, NC3000, NC3000L, and NC3100

(biphenyl epoxy resins), manufactured by Nippon Kayaku Co., Ltd.; ESN475V (a naphthalene epoxy resin) and ESN485 (a naphthol novolac epoxy resin), manufactured by NIPPON STEEL Chemical & Material Co., Ltd.; YX4000H and YL6121 (biphenyl epoxy resins), YX4000HK (a bixylenol epoxy resin), and YX8800 (an anthracene epoxy resin), manufactured by Mitsubishi Chemical Corporation; PG-100 and CG-500, manufactured by Osaka Gas Chemicals Co., Ltd., and YL7760, manufactured by Mitsubishi Chemical Corporation (bisphenol AF epoxy resins), and YL7800 (a fluorene epoxy resin), jER1010 (a solid bisphenol A epoxy resin), and jER1031S (a tetraphenylethane epoxy resin), manufactured by Mitsubishi Chemical Corporation. These solid epoxy resins may be used alone or two or more kinds thereof may be used in combination.

When a liquid epoxy resin and a solid epoxy resin are used in combination as the component (B), the mass ratio of these epoxy resins (liquid epoxy resin:solid epoxy resin) falls within a range of preferably 1:0.1 to 1:4, more preferably 1:0.3 to 1:3.5, and still more preferably 1:0.6 to 1:3.

The epoxy equivalent of the epoxy resin serving as the component (B) is preferably 50 g/eq. to 5000 g/eq., more preferably 50 g/eq. to 3000 g/eq., still more preferably 80 g/eq. to 2000 g/eq., and still more preferably 110 g/eq. to 1000 g/eq. When the epoxy equivalent is within the above-mentioned range, a cured product has a sufficient crosslinking density, so that a magnetic layer having a lower surface roughness can be offered. Note that the epoxy equivalent can be measured in accordance with JIS K7236, and is the mass of a resin containing one equivalent of epoxy group.

The weight-average molecular weight of the epoxy resin serving as the component (B) is preferably 100 to 5,000, more preferably 250 to 3,000, and still more preferably 400 to 1,500. Here, the weight-average molecular weight of the epoxy resin is a weight-average molecular weight in terms of polystyrene, measured by gel permeation chromatography (GPC).

As the active ester based resin, a resin having at least one active ester group in one molecule can be used. In particular, the active ester based resin is preferably a resin having two or more highly reactive ester groups in one molecule, such as phenol esters, thiophenol esters, N-hydroxyamine esters, and esters of heterocyclic hydroxy compounds. The active ester based resin is preferably obtained by a condensation reaction of a carboxylic acid compound and/or a thiocarboxylic acid compound with a hydroxy compound and/or a thiol compound. In particular, from the viewpoint of enhancing heat resistance, the active ester based resin is preferably an active ester based resin obtained from a carboxylic acid compound and a hydroxy compound, and is more preferably an active ester based resin obtained from a carboxylic acid compound and a phenol compound and/or a naphthol compound.

Examples of the carboxylic acid compound include benzoic acid, acetic acid, succinic acid, maleic acid, itaconic acid, phthalic acid, isophthalic acid, terephthalic acid, and pyromellitic acid.

Examples of the phenol compound and the naphthol compound include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene diphenol compound, and phenol novolac. Here, the "dicyclopentadiene diphenol compound" is a diphenol compound obtained by condensation of one molecule of dicyclopentadiene and two molecules of phenol.

Specific preferable examples of the active ester based resin include an active ester based resin having a dicyclopentadiene diphenol structure, an active ester based resin having a naphthalene structure, an active ester based resin containing acetylated phenol novolac, and an active ester based resin containing benzoylated phenol novolac. Among them, an active ester based resin having a naphthalene structure and an active ester based resin having a dicyclopentadiene diphenol structure are more preferably used. The "dicyclopentadiene diphenol structure" is a divalent structural unit composed of phenylene-dicyclopentylene-phenylene.

Examples of a commercially available active ester based resin include: EXB9451, EXB9460, EXB9460S, HPC-8000-65T, HPC-8000H-65TM, and EXB-8000L-65TM (manufactured by DIC Corporation) as the active ester based resin having a dicyclopentadiene diphenol structure; EXB9416-70BK and EXB-8150-65T (manufactured by DIC Corporation) as the active ester based resin having a naphthalene structure; DC808 (manufactured by Mitsubishi Chemical Corporation) as the active ester based resin containing acetylated phenol novolac; YLH1026 (manufactured by Mitsubishi Chemical Corporation) as the active ester based resin containing benzoylated phenol novolac; DC808 (manufactured by Mitsubishi Chemical Corporation) as the active ester based resin being acetylated phenol novolac; YLH1026 (manufactured by Mitsubishi Chemical Corporation), YLH1030 (manufactured by Mitsubishi Chemical Corporation), and YLH1048 (manufactured by Mitsubishi Chemical Corporation) as the active ester based resin being benzoylated phenol novolac.

From the viewpoints of heat-resistance and water-resistance, the phenol based resin and the naphthol based resin preferably have a novolac structure. Furthermore, from the viewpoint of adhesion to a conductive layer, a nitrogen containing phenol based curing agent is preferably used, and a triazine skeleton containing phenol based resin is more preferably used.

Specific examples of the phenol based resin and the naphthol based resin include MEH-7700, MEH-7810, and MEH-7851, manufactured by Meiwa Plastic Industries, Ltd.; NHN, CBN, and GPH, manufactured by Nippon Kayaku Co., Ltd.; SN170, SN180, SN190, SN475, SN485, SN495, SN-495V, SN375, and SN395, manufactured by NIPPON STEEL Chemical & Material Co., Ltd.; and TD-2090, LA-7052, LA-7054, LA-1356, LA-3018-50P, and EXB-9500, manufactured by DIC Corporation.

Specific examples of the benzoxazine based resin include JBZ-OD100 (benzoxazine ring equivalent: 218), JBZ-OP100D (benzoxazine ring equivalent: 218), and ODA-BOZ (benzoxazine ring equivalent: 218), manufactured by JFE Chemical Corporation; P-d (benzoxazine ring equivalent: 217) and F-a (benzoxazine ring equivalent: 217), manufactured by SHIKOKU CHEMICALS CORPORATION; and HFB2006M (benzoxazine ring equivalent: 432), manufactured by Showa Highpolymer Co., Ltd.

Examples of the cyanate ester based resin include difunctional cyanate resins, such as bisphenol A dicyanate, polyphenol cyanate, oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenyl-methane), bis(4-cyanate-3,5-dimethylphenyl)methane, 1,3-bis(4-cyanatephenyl-1-(methylethylidene))benzene, bis(4- cyanatephenyl)thioether, and bis(4-cyanatephenyl)ether; polyfunctional cyanate resins derived from, for example, phenol novolac and cresol novolac; and prepolymers in which these cyanate resins are partially triazinized. Specific examples of the cyanate ester based resin include PT30 and PT60 (phenol novolac polyfunctional cyanate ester resins), ULL-950S (a polyfunctional cyanate ester resin), and BA230 and BA230S75 (prepolymers in which bisphenol A dicyanate is partially or entirely triazinized to form a trimer), manufactured by Lonza Japan Ltd.

Specific examples of the carbodiimide based resin include CARBODILITE (registered trademark) V-03 (carbodiimide group equivalent: 216), V-05 (carbodiimide group equivalent: 262), V-07 (carbodiimide group equivalent: 200), and V-09 (carbodiimide group equivalent: 200), manufactured by Nisshinbo Chemical Inc.; and Stabaxol (registered trademark) P (carbodiimide group equivalent: 302), manufactured by Rhein Chemie Rheinau.

Examples of the amine based resin include resins having at least one amino group in one molecule, such as aliphatic amines, polyether amines, cycloaliphatic amines, and aromatic amines. Among these amine based resins, aromatic amines are preferably used from the viewpoint of achieving desired effects of the present invention. The amine based resin is preferably a primary amine or a secondary amine, and more preferably a primary amine. Specific examples of an amine based curing agent include 4,4'-methylenebis(2,6-dimethylaniline), diphenyldiaminosulfone, 4,4'-diaminodiphenylmethane, 4,4'-diaminodiphenylsulfone, 3,3'-diaminodiphenylsulfone, m-phenylenediamine, m-xylylenediamine, diethyltoluenediamine, 4,4'-diaminodiphenylether, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3-dimethyl-5,5-diethyl-4,4-diphenylmethanediamine, 2,2-bis(4-aminophenyl) propane, 2,2-bis(4-(4-aminophenoxy)phenyl)propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl) sulfone, and bis(4-(3-aminophenoxy)phenyl)sulfone. A commercially available amine-based resin may be used, and examples thereof include KAYABOND C-200S, KAYABOND C-100, KAYAHARD A-A, KAYAHARD A-B, and KAYAHARD A-S, manufactured by Nippon Kayaku Co., Ltd.; and Epi-Cure W, manufactured by Mitsubishi Chemical Corporation.

Examples of the acid anhydride based resin include a resin having at least one acid anhydride group in one molecule. Specific examples of the acid anhydride based resin include phthalic anhydride, tetrahydrophthalic anhydride, hexahydrophthalic anhydride, methyltetrahydrophthalic anhydride, methylhexahydrophthalic anhydride, methyl nadic anhydride, hydrogenated methyl nadic anhydride, trialkyltetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, pyromellitic anhydride, benzophenone tetracarboxylic dianhydride, biphenyl tetracarboxylic dianhydride, naphthalene tetracarboxylic dianhydride, oxydiphthalic dianhydride, 3,3'-4,4'-diphenylsulfone tetracarboxylic dianhydride, 1,3,3a,4,5,9b-hexahydro-5-(tetrahydro-2,5-dioxo-3-furanyl)-naphto[1,2-C]furan-1,3-dione, ethylene glycol bis(anhydrotrimellitate), and an acid anhydride polymer such as a styrene-maleic-acid resin obtained by copolymerization of styrene and maleic acid.

When an epoxy resin and curing agents are contained as the component (B), the amount ratio of the epoxy resin to all the curing agents is the ratio of [the total number of epoxy groups in the epoxy resin]:[the total number of reactive groups in the curing agents], and is preferably in a range of 1:0.01 to 1:5, more preferably in a range of 1:0.5 to 1:3, and still more preferably in a range of 1:1 to 1:2. Here, "the total number of epoxy groups in the epoxy resin" is a value obtained by dividing the mass of non-volatile components in the epoxy resin present in the magnetic paste by an epoxy equivalent and summing all the resulting values. Furthermore, "the total number of reactive groups of the curing agents" is a value obtained by dividing the mass of non-volatile components in the curing agents present in the magnetic paste by a reactive group equivalent and summing all the resulting values.

Thermoplastic Resin

The weight-average molecular weight of the thermoplastic resin in terms of polystyrene is preferably 30,000 or more, more preferably 50,000 or more, and still more preferably 100,000 or more, and preferably 1,000,000 or less, more preferably 750,000 or less, and still more preferably 500,000 or less. The weight-average molecular weight of the thermoplastic resin in terms of polystyrene is measured by gel permeation chromatography (GPC). Specifically, the weight-average molecular weight of the thermoplastic resin in terms of polystyrene can be measured at a column temperature of 40° C. by using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and calculated using a calibration curve of a standard polystyrene.

Examples of the phenoxy resin include a phenoxy resin having at least one skeleton selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. An end of the phenoxy resin may be any functional group, such as a phenolic hydroxyl group or an epoxy group. The phenoxy resin may be used alone or two or more kinds thereof may be used in combination. Specific examples of the phenoxy resin include 1256 and 4250 (each being a bisphenol A skeleton-containing phenoxy resin), YX8100 (a bisphenol S skeleton-containing phenoxy resin), and YX6954 (a bisphenol acetophenone skeleton-containing phenoxy resin), manufactured by Mitsubishi Chemical Corporation; and furthermore, FX280 and FX293, manufactured by NIPPON STEEL Chemical & Material Co., Ltd.; and YL7500BH30, YX6954BH30, YX7553, YX7553BH30, YL7769BH30, YL6794, YL7213, YL7290, and YL7482, manufactured by Mitsubishi Chemical Corporation.

From the viewpoint of further decreasing the coefficient of thermal expansion and the modulus of elasticity, the acrylic resin is preferably a functional group-containing acrylic resin, and more preferably an epoxy group-containing acrylic resin having a glass transition temperature of 25° C. or lower.

The number average molecular weight (Mn) of the functional group-containing acrylic resin is preferably 10,000 to 1,000,000, and more preferably 30,000 to 900,000.

The functional group equivalent of the functional group-containing acrylic resin is preferably 1,000 to 50,000, and more preferably 2,500 to 30,000.

The epoxy group-containing acrylic resin having a glass transition temperature of 25° C. or lower is preferably an epoxy group-containing acrylic ester copolymer resin having a glass transition temperature of 25° C. or lower, and examples thereof include SG-80H (an epoxy group-containing acrylic ester copolymer resin (the number average molecular weight Mn: 350,000 g/mol, epoxy equivalent: 0.07 eq/kg, glass transition temperature: 11° C.)), manufactured by Nagase ChemteX Corporation, and SG-P3 (an epoxy group-containing acrylic ester copolymer resin (the number average molecular weight Mn: 850,000 g/mol, epoxy equivalent: 0.21 eq/kg, glass transition temperature: 12° C.)), manufactured by Nagase ChemteX Corporation.

Specific examples of the polyvinyl acetal resin and the butyral resin include Denka Butyral 4000-2, 5000-A, 6000-C, and 6000-EP, manufactured by Denka Company Limited; and S-LEC BH series, BX series, KS series such as KS-1, BL series such as BL-1, and BM series, manufactured by SEKISUI CHEMICAL CO., LTD.

Specific examples of the polyimide resin include RIKACOAT SN20 and RIKACOAT PN20, manufactured by New Japan Chemical Co., Ltd. Other specific examples of the polyimide resin include modified polyimides, such as a linear polyimide obtained by reacting a bifunctional hydroxyl terminated polybutadiene with a diisocyanate compound and a tetrabasic acid anhydride (a polyimide described in Japanese Patent Application Laid-open No. 2006-37083, which is incorporated herein by reference in its entirety) and polysiloxane skeleton-containing polyimides (polyimides described in, for example, Japanese Patent Application Laid-open No. 2002-12667 and Japanese Patent Application Laid-open No. 2000-319386, which are incorporated herein by reference in their entireties).

Specific examples of the polyamideimide resin include VYLOMAX HR11NN and VYLOMAX HR16NN, manufactured by TOYOBO CO., LTD. Other specific examples of the polyamideimide resin include modified polyamideimides, such as KS9100 and KS9300 (polysiloxane skeleton-containing polyamideimides), manufactured by Hitachi Chemical Co., Ltd.

Specific examples of the polyether sulfone resin include PES5003P, manufactured by SUMITOMO CHEMICAL COMPANY, LIMITED. Specific examples of polyphenylene ether resin include an oligo phenylene ether styrene resin having a vinyl group, OPE-2St 1200, manufactured by MITSUBISHI GAS CHEMICAL COMPANY, INC.

Specific examples of the polysulfone resin include polysulfones, P1700 and P3500, manufactured by SOLVAY ADVANCED POLYMERS, LLC.

In particular, the thermoplastic resin is preferably at least one selected from a phenoxy resin, a polyvinyl acetal resin, a butyral resin, and an acrylic resin, each having a weight-average molecular weight of 30,000 or more and 1,000,000 or less.

From the viewpoint of achieving a magnetic layer excellent in mechanical strength and insulation reliability, the content of the binder resin (B) is preferably 1% by mass or higher, more preferably 3% by mass or higher, and still more preferably 4% by mass or higher with respect to 100% by mass of non-volatile components in the magnetic paste. The upper limit of the content of the binder resin (B) is not particularly limited as long as effects of the present invention are achieved, but is preferably 30% by mass or lower, more preferably 25% by mass or lower, and still more preferably 20% by mass or lower.

The binder resin (B) is preferably an epoxy resin, and more preferably a liquid epoxy resin. The content of the liquid epoxy resin is preferably 1% by mass or higher, more preferably 2% by mass or higher, and still more preferably 3% by mass or higher, with respect to 100% by mass of the component (A). The upper limit of the content of the liquid epoxy resin is preferably 70% by mass or lower, more preferably 60% by mass or lower, still more preferably 55% by mass or lower, and still more preferably 20% by mass or lower.

Curing Accelerator (C)

The magnetic paste may further contain a curing accelerator (C) as an optional component.

Examples of the curing accelerator include an amine based curing accelerator, an imidazole based curing accelerator, a phosphorus based curing accelerator, a guanidine based curing accelerator, and a metal based curing accelerator. From the viewpoint of lowering the viscosity of the magnetic paste, the curing accelerator is preferably an amine based curing accelerator and an imidazole based curing accelerator, and more preferably an imidazole based curing accelerator. The curing accelerator may be used alone or two or more kinds thereof may be used in combination.

Examples of the amine based curing accelerator include trialkylamines such as triethylamine and tributylamine, 4-dimethylaminopyridine, benzyldimethylamine, 2,4,6-tris(dimethylaminomethyl)phenol, and 1,8-diazabicyclo(5,4,0)-undecene. The amine-based curing accelerator is preferably 4-dimethylaminopyridine or 1,8-diazabicyclo(5,4,0)-undecene.

As the amine based curing accelerator, a commercially available amine-based curing accelerator may be used, and examples thereof include PN-50, PN-23, and MY-25 manufactured by Ajinomoto Fine-Techno Co., Inc.

Examples of the imidazole based curing accelerator include imidazole compounds, such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and an adduct of an imidazole compound and an epoxy resin. The imidazole-based curing accelerator is preferably 2-ethyl-4-methylimidazole or 1-benzyl-2-phenylimidazole.

As the imidazole based curing accelerator, a commercially available imidazole based curing accelerator may be used, and examples thereof include 2P4MZ and 2PHZ-PW, manufactured by SHIKOKU CHEMICALS CORPORATION, and P200-H50, manufactured by Mitsubishi Chemical Corporation.

Examples of the phosphorus based curing accelerator include triphenylphosphine, a phosphonium borate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. The phosphorus-based curing accelerator is preferably triphenylphosphine or tetrabutylphosphonium decanoate.

Examples of the guanidine based curing accelerator include dicyandiamide, 1-methylguanidine, 1-ethylguanidine, 1-cyclohexylguanidine, 1-phenylguanidine, 1-(o-tolyl) guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. The guanidine-based curing accelerator is preferably dicyandiamide or 1,5,7-triazabicyclo[4.4.0]dec-5-ene.

Examples of the metal based curing accelerator include organic metal complexes and organic metal salts of metals such as cobalt, copper, zinc, iron, nickel, manganese, and tin. Specific examples of the organic metal complex include organic cobalt complexes, such as cobalt (II) acetylacetonate and cobalt (III) acetylacetonate, an organic copper complex such as copper (II) acetylacetonate, an organic zinc complex such as zinc (II) acetylacetonate, an organic iron complex such as iron (III) acetylacetonate, an organic nickel complex such as nickel (II) acetylacetonate, and an organic manganese complex such as manganese (II) acetylacetonate. Examples of the organic metal salt include zinc octoate, tin octoate, zinc naphthenate, cobalt naphthenate, tin stearate, and zinc stearate.

From the viewpoint of achieving desired effects of the present invention, the curing accelerator (C) is preferably at least one selected from an amine based curing accelerator, and an imidazole based curing accelerator, and more preferably at least one selected from an amine based curing accelerator and an imidazole based curing accelerator.

From the viewpoint of accelerating the curing of the magnetic paste, the content of the curing accelerator (C) is preferably 0.1% by mass or higher, more preferably 0.3% by mass or higher, and still more preferably 0.5% by mass or higher with respect to 100% by mass of non-volatile components in the magnetic paste, and the upper limit thereof is preferably 20% by mass or lower, more preferably 15% by mass or lower, and still more preferably 10% by mass or lower.

(D) Dispersant

The magnetic paste may further contain a dispersant (D) as an optional component.

Examples of the dispersant (D) include phosphate based dispersants, such as polyoxyethylene alkyl ether phosphate; anionic dispersants, such as sodium dodecylbenzene sulfonate, sodium lauryl sulfate, and an ammonium salt of polyoxyethylene alkylether sulfate; and nonionic dispersants, such as an organosiloxane based dispersant, acetyleneglycol, polyoxyethylene alkyl ether, polyoxyethylene alkyl ester, polyoxyethylene sorbitan fatty acid ester, polyoxyethylene alkyl phenyl ether, polyoxyethylene alkylamine, and polyoxyethylene alkyl amide. In particular, the dispersant (E) is preferably an anionic dispersant. The dispersant may be used alone, or two or more kinds thereof may be used in combination.

A commercially available phosphate based dispersant can be used. Examples of the commercially available phosphate based dispersant include phosphanol series RS-410, RS-610, and RS-710, manufactured by TOHO Chemical Industry Co., Ltd.

Examples of a commercially available organosiloxane based dispersant include BYK347 and BYK348, manufactured by BYK-Chemie GmbH.

Examples of a commercially available polyoxyalkylene based dispersant include MALIALIM series AKM-0531, AFB-1521, SC-0505K, SC-1015F, and SC-0708A, and HKM-50A, manufactured by NOF CORPORATION.

Examples of commercially available acetyleneglycol include SURFYNOL series 82, 104, 440, 465, and 485, and Olefin Y, manufactured by Air Products and Chemicals Inc.

From the viewpoint of remarkably achieving the effects of the present invention, the content of the dispersant (D) is preferably 0.1% by mass or higher, more preferably 0.3% by mass or higher, and still more preferably 0.5% by mass or higher, with respect to 100% by mass of the non-volatile components in the magnetic paste. The upper limit of the content is preferably 5% by mass or lower, more preferably 3% by mass or lower, and still more preferably 1% by mass or lower.

(E) Other Additives

The magnetic paste may further contain other additives (E), if needed. Examples of the other additives include a curing retardant, such as triethyl borate, for the purpose of enhancing pot life; an inorganic filler (except an inorganic filler equivalent to the magnetic powder); a fire retardant; an organic filler; organometallic compounds, such as an organocopper compound, an organozinc compound; and an organocobalt compound, and resin additives, such as a thickener, a defoaming agent, a leveling agent, an adhesion imparting agent, and a colorant.

The content of the above-mentioned solvent in the magnetic paste is preferably less than 1.0% by mass, more preferably 0.8% by mass or lower, still more preferably 0.5% by mass or lower, and particularly preferably 0.1% by mass or lower, with respect to the total mass of the magnetic paste. The lower limit of the content of the solvent is not particularly limited, but is 0.001% by mass or higher, or alternatively the magnetic paste does not contain the solvent. When the content of an organic solvent is kept within the above-mentioned range, a problem caused by the volatilization of the organic solvent (for example, the generation of a void) can be suppressed and the handleability and workability of the magnetic paste can be enhanced.

Method for Producing Magnetic Paste

The magnetic paste can be produced, for example, by stirring blending components with a stirrer, such as a three-roll mill, a rotary mixer, or a high-speed rotary mixer. The magnetic paste of the present invention may be subjected to degassing after being produced for example. Examples of the degassing include degassing by still standing, centrifugal degassing, vacuum degassing, stirring degassing, or a combination thereof.

Physical Properties and Other Properties of Magnetic Paste

The magnetic paste of the present invention contains the magnetic powder having a predetermined particle diameter distribution, and thus the magnetic powder is suppressed from being unevenly distributed in the magnetic paste. Specifically, for example, by using a centrifugal separator (for example, a rotation/revolution mixer, Awatori Rentaro ARE-250 or ARE-310, manufactured by THINKY CORPORATION), the magnetic paste is centrifuged at a rotation speed of 2,000 rpm for 5 minutes, and the viscosity of the magnetic paste before centrifugal separation and the viscosity of the magnetic paste in a top layer in a container after centrifugal separation are measured at rotation speeds of 0.5 rpm and 5 rpm under the conditions of 3°×R9.7 cone-rotor and a sample temperature of 25±2° C. by using an E-type viscometer (for example, RE-80U, manufactured by TOKI SANGYO CO., LTD). A thixotropy index T.I. is calculated by (viscosity at 0.5 rpm)/(viscosity at 5 rpm), and a thixotropy index ratio (T.I.(β)/T.I.(α)) is calculated, wherein T.I.(α) is the thixotropy index T.I. of the magnetic paste before centrifugal separation, and T.I.(β) is the thixotropy index T.I. of the magnetic paste in the top layer in the container after centrifugal separation. The resulting T.I.(β)/T.I.(α) is preferably 0.7 or more and 1.0 or less, more preferably 0.8 or more and 1.0 or less, and still more preferably 0.9 or more and 1.0 or less. Specifically, the measurement of T.I.(β)/T.I.(α) can be performed by a method described in the later-mentioned Examples.

The magnetic paste of the present invention contains the magnetic powder having a predetermined particle diameter distribution, and thus the magnetic powder is suppressed from being unevenly distributed in the magnetic paste. As a result, the magnetic paste has the capability of being more easily discharged. Specifically, for example, a syringe is filled with the magnetic paste, and the magnetic paste is subjected to centrifugal degassing by using a centrifugal separator. When a needle is connected to the syringe and a discharge test is performed using a dispenser (the magnetic paste is discharged at 100 points each having a size of 1 mm×1 mm and a clearance gap therebetween of 100 μm on a glass plate every 10 minutes), the magnetic paste can be discharged from the syringe without the clogging of the syringe with the magnetic paste. The capability of being more easily discharged can be measured in detail by a method described in the later-mentioned Examples.

A cured product obtained by thermal curing the magnetic paste (for example, a cured product obtained by thermal curing at 180° C. for 90 minutes) usually has the property of having a high relative magnetic permeability at a frequency of 100 MHz. For example, the magnetic paste in a sheet form is subjected to thermal curing at 180° C. for 90 minutes to obtain a cured product in a sheet form. The relative magnetic permeability of this cured product at a frequency of 100 MHz is preferably 5 or higher, more preferably 7 or higher, and still more preferably 7.5 or higher. The upper limit of the relative magnetic permeability can be usually 20 or lower, for example.

Inductor Element

An inductor element of the present invention includes a magnetic layer that is a cured product of the magnetic paste of the present invention. The inductor element mentioned herein includes not only an inductor element as an electronic component, but also an inductor element included in a circuit board. The FIGURE is a schematic plan view of an inductor element according to an embodiment of the present invention. An inductor element 1 includes a substrate 11, a magnetic layer 12, and wiring 13 formed of a conductor. The wiring 13 is covered with the magnetic layer 12. The wiring 13 is spirally wound around a core part 14 serving as a center. In the core part 14, the magnetic layer 12 is embedded.

Hereinafter, through a description about a method for producing the inductor element, the inductor element and the method for producing the inductor element will be described.

The method for producing the inductor element includes the steps of:

(1) discharging a magnetic paste onto a substrate and thermal curing the magnetic paste to form a first magnetic layer;

(2) forming wiring on the first magnetic layer; and (3) discharging the magnetic paste onto the first magnetic layer, a core part, and the wiring and thermal curing the magnetic paste to form a second magnetic layer, wherein the magnetic layer 12 includes the first magnetic layer and the second magnetic layer.

Step (1)

At the step (1), the magnetic paste is discharged onto the substrate and the magnetic paste is heat-cured to form the first magnetic layer. The step (1) may include the step of preparing the magnetic paste. The magnetic paste is as described in the above.

The substrate is usually an insulating substrate. Examples of the substrate include insulating substrates, such as a glass epoxy substrate, a metal substrate, a polyester substrate, a polyimide substrate, a bismaleimide triazine (BT) resin substrate, and a thermosetting polyphenylene ether substrate. The substrate may be an inner layer circuit substrate in which, for example, wiring is laid within a range of the thickness of the substrate.

The magnetic paste is filled into a syringe, a needle, a cartridge, and the like, and the magnetic paste is discharged by a discharging device, such as a dispenser, to be applied onto the substrate. Alternatively, the magnetic paste may be applied onto the substrate by overall printing or pattern printing. After being applied, the magnetic paste is thermally cured to obtain the first magnetic layer.

Conditions for thermal curing the magnetic paste are different in accordance with a composition and a kind of the magnetic paste, but the curing temperature is preferably 120° C. or higher, more preferably 130° C. or higher, and still more preferably 150° C. or higher, and preferably 240° C. or lower, more preferably 220° C. or lower, and still more preferably 200° C. or lower. The time for curing the magnetic paste is preferably 5 minutes or longer, more preferably 10 minutes or longer, and still more preferably 15 minutes or longer, and preferably 120 minutes or shorter, more preferably 100 minutes or shorter, and still more preferably 90 minutes or shorter.

Prior to the thermal curing of the magnetic paste, the magnetic paste may be subjected to a preliminary heat treatment by heating at the temperature lower than the curing temperature. The temperature for the preliminary heat treatment is preferably 50° C. or higher, preferably 60° C. or higher, and more preferably 70° C. or higher, and preferably less than 120° C., and preferably 110° C. or lower, and more preferably 100° C. or lower. A period of time for the preliminary heat treatment is normally preferably 5 minutes or longer, and more preferably 15 minutes or longer, and preferably 150 minutes or shorter, and more preferably 120 minutes or shorter.

Step (2)

At the step (2), wiring is formed on the first magnetic layer formed at the step (1). Examples of a method for forming the wiring include plating, sputtering, and vapor deposition. Among these methods, plating is preferably used. In a preferable embodiment, a surface of the first magnetic layer is subjected to plating with an appropriate method, such as a semi-additive method or a full-additive method, to form wiring having a spiral wiring pattern.

Examples of a material of the wiring include single metals, such as gold, platinum, palladium, silver, copper, aluminum, cobalt, chromium, zinc, nickel, titanium, tungsten, iron, tin, and indium; and alloys of two or more kinds of metals selected from the group consisting of gold, platinum, palladium, silver, copper, aluminum, cobalt, chromium, zinc, nickel, titanium, tungsten, iron, tin, and indium. Among these metals, from the viewpoints of for example, versatility, cost, and ease of patterning, chromium, nickel, titanium, aluminum, zinc, gold, palladium, silver, copper, a nickel-chrome alloy, a copper-nickel alloy, or a copper-titanium alloy is preferably used. Chromium, nickel, titanium, aluminum, zinc, gold, palladium, silver, copper, or a nickel-chrome alloy is more preferably used. Copper is still more preferably used.

Here, an embodiment example in which the wiring is formed on the first magnetic layer will be described in detail. A plating seed layer is formed on the first magnetic layer by non-electrolytic plating. Subsequently, an electrolytic plating layer is formed on the formed plating seed layer by electrolytic plating, and an unnecessary plating seed layer is removed by, for example, etching, if needed, so that wiring having a desired circuit pattern can be formed. After the formation of the wiring, annealing treatment may be performed, if needed, for the purpose of, for example, enhancing the peel strength of the wiring. The annealing treatment can be performed by, for example, heating a board at 150° C. to 200° C. for 20 to 90 minutes.

After the formation of the wiring, a mask pattern configured to cause a part of the plating seed layer to be exposed is formed on the formed plating seed layer so as to correspond to the spiral wiring pattern. In this case, an electrolytic plating layer is formed on the exposed plating seed layer by electrolytic plating, and then the mask pattern is removed. Subsequently, an unnecessary part of the plating seed layer is removed by etching or the like to form wiring having a desired pattern.

From the viewpoint of slimming down, the thickness of the wiring is preferably 70 µm or less, more preferably 60 µm or less, still more preferably 50 µm or less, still more preferably 40 µm or less, and particularly preferably 30 µm or less, 20 µm or less, 15 µm or less, or 10 µm or less. The lower limit of the thickness is preferably 1 µm or more, more preferably 3 µm or more, and still more preferably 5 µm or more.

Step (3)

At the step (3), the magnetic paste is discharged onto the first magnetic layer, the core part, and the wiring, and the magnetic paste is heat-cured to form the second magnetic layer. A method for forming the second magnetic layer is the same as that for forming the first magnetic layer. The magnetic paste that forms the first magnetic layer and the magnetic paste that forms the second magnetic layer may be the same or may be different from each other.

After the step (1), the step of forming an insulating layer on the first magnetic layer may be provided. Alternatively, after the step (2), the step of forming an insulating layer on the wiring may be provided. The insulating layer may be formed in the same manner as for the formation of an insulating layer of a printed wired board, and the same material as that of the insulating layer of the printed wiring board may be used.

Circuit Substrate

A circuit substrate includes the inductor element of the present invention. Such a circuit substrate can be used as a wiring board on which an electronic component, such as a semiconductor chip, is to be mounted, or the inductor substrate can be used as a (multilayer) printed wiring board that uses the wiring board as an inner layer substrate. Alternatively, the inductor substrate can be used as a chip inductor component obtained by making the wiring board into individual pieces, or can be used as a printed wiring board onto which the chip inductor component is surface-mounted.

Using the wiring board, various types of semiconductor devices can be produced. A semiconductor device including the wiring board can be preferably used for electrical products (for example, a computer, a cellular phone, a digital camera, and a television) and vehicles (for example, a motorcycle, an automobile, a train, a ship, and an airplane).

Other features of the invention will become apparent in the course of the following descriptions of exemplary embodiments which are given for illustration of the invention and are not intended to be limiting thereof.

EXAMPLES

Note that, in the following description, "part(s)" and "%" representing an amount mean "part(s) by mass" and "% by mass", respectively, unless otherwise specified.
Preparation of Magnetic Powder a As the magnetic powder having a spherical shape, soft magnetic powder (Fe—Mn based ferrite, trade-named M-series, having a spherical shape, and manufactured by Powdertech Co., Ltd.) was used. Using a pneumatic classifier (Turbo Classifier TC-15NS, manufactured by NISSHIN ENGINEERING INC.), air was blown toward the soft magnetic powder at a blade rotation speed of 1,850 rpm and an airflow rate of 1.5 m$^3$/min to blow off particles being light in weight and collect particles being heavy in weight, and thus magnetic powder a was obtained.

Using a laser diffraction type particle diameter distribution measurement device (SALD-2200, manufactured by SHIMADZU CORPORATION, dispersion medium: pure water, ultrasonic operation, refractive index: 1.70-0.50i), the particle diameter distribution of the magnetic powder a was determined. As a result, the particle diameter distribution of the magnetic powder a was such that $D_{10}$ was 0.426 µm, $D_{50}$ was 2.72 µm, and $D_{90}$ was 5.43 µm.
Preparation of Magnetic Powders b to g By suitably changing the rotation speed of rotating blades and the airflow rate in the preparation of the magnetic powder a, magnetic powders b to g were prepared. The particle diameter distributions of the magnetic powders b to g were determined in the same manner as that in "Preparation of Magnetic Powder a", and Table 1 below shows the results (all the results are expressed in the unit µm).

TABLE 1

| | Magnetic Powder | | | | | | |
| --- | --- | --- | --- | --- | --- | --- | --- |
| | a | b | c | d | e | f | g |
| $D_{10}$ | 0.426 | 1.65 | 0.696 | 0.406 | 0.163 | 0.241 | 0.140 |
| $D_{50}$ | 2.72 | 3.63 | 3.15 | 2.06 | 1.03 | 1.32 | 0.528 |
| $D_{90}$ | 5.43 | 7.96 | 6.68 | 5.07 | 4.31 | 3.61 | 2.24 |

Example 1: Production of Magnetic Paste 1

To 80 parts by mass of the magnetic powder a, 15 parts by mass of an epoxy resin (ZX-1059, a mixed product of a bisphenol A epoxy resin and a bisphenol F epoxy resin, manufactured by NIPPON STEEL Chemical & Material Co., Ltd.) and 5 parts by mass of a curing accelerator (2P4MZ, an imidazole based curing accelerator, manufactured by SHIKOKU CHEMICALS CORPORATION) were added, and the resultant mixture was uniformly dispersed using a high-speed rotary mixer to obtain a magnetic paste 1.

Examples 2 to 4 and Comparative Examples 1 to 3: Production of Magnetic Pastes 2 to 7

Components were blended at blending ratios illustrated in Table 2 below, and the resultant mixtures were uniformly dispersed using a high-speed rotary mixer in the same manner in that in Example 1 to obtain magnetic pastes 2 to 7.

Measurement of Thixotropy (T.I.(β)/T.I.(α)) of Magnetic Paste

While each of the magnetic pastes 1 to 7 was kept at 25±2° C., the viscosity thereof was measured using an E-type viscometer (RE-80U, manufactured by TOKI SANGYO CO., LTD, 3°×R9.7 cone-rotor (0.22 ml of measurement sample), at rotation speeds of 0.5 rpm and 5 rpm). The thixotropy index T.I.(α) was calculated by (viscosity at 0.5 rpm)/(viscosity at 5 rpm). Next, the magnetic pastes 1 to 7 were subjected to centrifugal degassing by using a centrifugal separator (a rotation/revolution mixer, Awatori Rentaro ARE-250, manufactured by THINKY CORPORATION, in a 150-ml container at 2,000 rpm for 5 minutes). The resin paste in a top layer in the sample container was collected as a sample for analysis, and while each of the magnetic pastes was kept at 25±2° C., the viscosity thereof was measured using an E-type viscometer (RE-80U, manufactured by TOKI SANGYO CO., LTD, 3°×R9.7 cone-rotor (0.22 ml of measurement sample), at rotation speeds of 0.5 rpm and 5 rpm), and the thixotropy index T.I.(β) was calculated by (viscosity at 0.5 rpm)/(viscosity at 5 rpm). A value of T.I.(β)/T.I.(α) was calculated, wherein T.I.(α) was the thixotropy index T.I. of each of the magnetic pastes before centrifugal separation, and T.I.(β) was the thixotropy index T.I. of each of the magnetic pastes in the top layer in the container after centrifugal separation.

In the magnetic pastes after centrifugal separation, it was observed that the magnetic powder having a larger particle diameter tended to sediment, while, in the upper layer in the container, the magnetic powder having a relatively smaller particle diameter was unevenly distributed, and accordingly the viscosity tended to be higher. In this case, it was observed that the viscosity at 5 rpm tended to be higher than the viscosity at 0.5 rpm, and the thixotropy in the upper layer tended to be lower.

Evaluation of Capability of being Discharged

Each of the magnetic pastes 1 to 7 was filled into a syringe (PSY-10E and a plunger MLP-B-10E, manufactured by Musashi Engineering, Inc.), and was subjected to centrifugal degassing by a centrifugal separator (AWATORN3, manufactured by Musashi Engineering, Inc., at 2,000 rpm for 5 minutes). A needle (manufactured by Musashi Engineering, Inc., gauge: 22, inner diameter: 0.42 mm) was connected to the syringe, and a discharge test (the magnetic paste was discharged at 100 points each having a size of 1 mm×1 mm and a clearance gap therebetween of 100 μm on a glass plate every 10 minutes) was performed using a dispenser (IMAGE MASTER 350PC SmartSMΩX, manufactured by Musashi Engineering, Inc., discharge pressure: 200 MPa·s, discharge time: 0.2 sec), and results were evaluated according to the following criteria.

○: the magnetic paste was capable of being discharged from the syringe without the clogging of the syringe with the magnetic paste.

x: the syringe was clogged with the magnetic paste at the time of discharge, so that the magnetic paste cannot be discharged from the syringe.

Measurement of Relative Magnetic Permeability

As a support, a polyethylene terephthalate (PET) film (PET501010, manufactured by LINTEC Corporation, 50 μm in thickness) having been subjected to treatment with a silicone-based mold-release agent was prepared. Each of the magnetic pastes 1 to 7 was uniformly applied onto a release surface of the PET film with a doctor blade so as to achieve a paste layer thickness of 100 μm after drying, whereby a resin sheet was obtained. The obtained resin sheet was heated at 180° C. for 90 minutes to thermal cure a paste layer, and the support was detached from the resin sheet to obtain a cured product in a sheet form. The obtained cured product was cut into a test piece having a width of 5 mm and a length of 18 mm to obtain an evaluation sample. The relative magnetic permeability (μ') of the evaluation sample were measured at a room temperature of 23° C. and a measurement frequency of 100 MHz by a three-turn coil method using HP8362B (manufactured by Agilent Technologies, Ltd).

TABLE 2

|  |  | Example | | | | Comparative Example | | |
|---|---|---|---|---|---|---|---|---|
|  |  | 1 | 2 | 3 | 4 | 1 | 2 | 3 |
| Resin Composition |  | 1 | 2 | 3 | 4 | 5 | 6 | 7 |
| Component (A) | Magnetic Powder a | 80 |  |  |  |  |  |  |
|  | Magnetic Powder b |  | 80 |  |  |  |  |  |
|  | Magnetic Powder c |  |  | 60 |  |  |  |  |
|  | Magnetic Powder d |  |  |  | 95 |  |  |  |
|  | Magnetic Powder e |  |  |  |  | 80 |  |  |
|  | Magnetic Powder f |  |  |  |  |  | 80 |  |
|  | Magnetic Powder g |  |  |  |  |  |  | 80 |
| Component (B) | ZX1059 | 15 | 15 | 30 | 4 | 15 | 15 | 15 |
| Component (C) | 2P4MZ | 5 | 5 | 10 | 1 | 5 | 5 | 5 |
| T.I(β)/T.I(α) |  | 1.0 | 0.9 | 0.8 | 0.8 | 0.4 | 0.6 | 0.2 |
| Capability of being discharged |  | ○ | ○ | ○ | ○ | X | X | X |
| Relative Magnetic Permeability μ' (100 MHz) |  | 12.3 | 9.3 | 8.0 | 13.7 | 7.0 | 6.5 | 5.5 |

It has been revealed from Examples 1 to 4 that, in each of the magnetic pastes containing the magnetic powder and the binder resin and having a particle diameter distribution of the magnetic powder within a predetermined range, the magnetic powder is suppressed from being unevenly distributed in the magnetic paste even after centrifugal separation, and the change in thixotropy before and after centrifugal separation is smaller. Furthermore, it has been found that the uneven distribution of the magnetic powder is suppressed, and as a result, the change in thixotropy before and after centrifugal separation is smaller, and accordingly the magnetic paste is capable of being more easily discharged from the syringe. Furthermore, it has been found that a cured product of each of the magnetic pastes of the present invention has a higher relative magnetic permeability.

In contrast, it has been found from Comparative Examples 1 to 3 that, when the particle diameter distribution of the magnetic powder is outside the predetermined range, the uneven distribution of the magnetic powder in the magnetic paste after centrifugal separation causes a considerable change in thixotropy. Furthermore, evaluations of the capability of being discharged have revealed that the clogging of the syringe with the magnetic paste possibly due to an increased thixotropy makes it difficult to discharge the magnetic paste from the syringe. Furthermore, it has been also found that a cured product of the magnetic paste has a lower relative magnetic permeability.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

What is claimed is:

1. A magnetic paste, comprising:
   (A) at least one magnetic powder; and
   (B) at least one binder resin (B), wherein
   in a particle diameter distribution of said at least one magnetic powder (A), a 10% particle diameter ($D_{10}$) is 0.2 μm or larger and 2.0 μm or smaller, a 50% particle diameter ($D_{50}$) is 2.0 μm or larger and 4.3 μm or smaller, and a 90% particle diameter ($D_{90}$) is 4.3 μm or larger and 8.5 μm or smaller.

2. The magnetic paste according to claim 1, wherein said at least one binder resin (B) comprises an epoxy resin.

3. The magnetic paste according to claim 1, wherein said at least one magnetic powder (A) is soft magnetic powder.

4. The magnetic paste according to claim 1, wherein the magnetic powder (A) is iron oxide powder.

5. The magnetic paste according to claim 4, wherein said iron oxide powder is ferrite containing at least one element selected from the group consisting of Ni, Cu, Mn, and Zn.

6. The magnetic paste according to claim 1, wherein said at least one magnetic powder (A) is Fe—Mn-based ferrite.

7. The magnetic paste according to claim 6, wherein said Mn in said Fe—Mn-based ferrite is present in an amount of 3.0% by mass or higher and 15% by mass or lower.

8. The magnetic paste according to claim 1, wherein said at least one magnetic powder (A) is present in an amount of 60% by mass or higher with respect to 100% by mass of non-volatile components in said magnetic paste.

9. The magnetic paste according to claim 1, wherein ($D_{90}$–$D_{10}$)/$D_{50}$ is 2.5 or less.

10. An inductor element, comprising a magnetic layer that is a cured product of a magnetic paste according to claim 1.

11. A circuit substrate, comprising a inductor element according to claim 10.

* * * * *